United States Patent
Park

(10) Patent No.: US 7,732,257 B2
(45) Date of Patent: Jun. 8, 2010

(54) SEMICONDUCTOR DEVICE AND METHOD OF FABRICATING THE SAME

(75) Inventor: Jin Ha Park, Echeon-si (KR)

(73) Assignee: Dongbu Hitek Co., Ltd., Seoul (KR)

( * ) Notice: Subject to any disclaimer, the term of this patent is extended or adjusted under 35 U.S.C. 154(b) by 53 days.

(21) Appl. No.: 11/926,147

(22) Filed: Oct. 29, 2007

(65) Prior Publication Data
US 2008/0122004 A1    May 29, 2008

(30) Foreign Application Priority Data
Nov. 27, 2006  (KR) ...................... 10-2006-0117460

(51) Int. Cl.
*H01L 21/00* (2006.01)
(52) U.S. Cl. .................. 438/110; 438/109; 257/684; 257/E21.661; 257/E21.499
(58) Field of Classification Search .................. 257/684, 257/E21.705, E21.702, E21.703, E21.661, 257/E21.499, E21.632, E27.098, E27.065; 438/110, 109
See application file for complete search history.

(56) References Cited

U.S. PATENT DOCUMENTS

| | | | | |
|---|---|---|---|---|
| 6,404,648 | B1 * | 6/2002 | Slupe et al. | 361/760 |
| 6,853,571 | B2 * | 2/2005 | Doller | 365/63 |
| 7,138,295 | B2 * | 11/2006 | Leedy | 438/109 |
| 7,164,113 | B2 * | 1/2007 | Inokuma et al. | 250/208.1 |
| 2007/0145367 | A1 * | 6/2007 | Chen et al. | 257/49 |

FOREIGN PATENT DOCUMENTS

| | | | |
|---|---|---|---|
| JP | 05-175445 | * | 7/1993 |
| KR | 10-1996-0013909 | | 6/1999 |
| KR | 10-2003-0048852 | | 1/2005 |

* cited by examiner

*Primary Examiner*—Caridad M Everhart
(74) *Attorney, Agent, or Firm*—Saliwanchik, Lloyd & Saliwanchik

(57) ABSTRACT

A semiconductor device and a fabricating method thereof are provided. The semiconductor device can include a first chip having transistors of only the NMOS type, a second chip having transistors of only the PMOS type, and an interconnection electrically connecting the first and second chips to each other. By forming NMOS and PMOS transistors on separate chips, the total number of implant photo processes can be decreased, thereby reducing the fabrication cost.

14 Claims, 7 Drawing Sheets

US 7,732,257 B2

SEMICONDUCTOR DEVICE AND METHOD OF FABRICATING THE SAME

CROSS-REFERENCE TO RELATED APPLICATION

The present application claims the benefit under 35 U.S.C. §119 of Korean Patent Application No. 10-2006-0117460, filed Nov. 27, 2006, which is hereby incorporated by reference in its entirety.

BACKGROUND

Semiconductor devices are being developed to be small in size, multi-functional, and have low power consumption. Accordingly, small and lightweight semiconductor packages are necessary to sufficiently implement desired characteristics into semiconductor devices.

It is often difficult to apply semiconductor device microcircuit fabrication technology to each product of a fabrication process. Complicated circuits can cause extension of the development period, enormous equipment investment, and an increase in process cost.

A unit cell of static random access memory (SRAM) generally includes six transistors (6T). Specifically, a unit cell of SRAM often includes four n-channel metal oxide semiconductor (NMOS) transistors and two p-channel metal oxide semiconductor (PMOS) transistors.

The implant processes typically required in fabricating SRAM include an implant for forming a well and a channel, an implant for forming a pocket and an lightly-doped drain (LDD), and an implant for forming a source and a drain. Since these processes must be performed for both NMOS and PMOS transistors, six implant processes are required.

Each implant process generally includes a photo process for opening an area in which an implant is to be performed, an ion implantation process for implanting dopants, an ashing process for removing a photoresist, and a cleaning process for removing a polymer that might remain after the ashing process with a cleaning liquid.

Accordingly, to fabricate the SRAM including six transistors, the total number of implant processes required can be 18 or more.

FIG. 1 is a circuit diagram of a related art unit cell of SRAM, and FIG. 2 is a layout of the related art unit cell of SRAM.

Referring to FIGS. 1 and 2, the related art unit cell of SRAM 10 includes four NMOS transistors (T1, T3, T5, T6) and two PMOS transistors (T2, T4) to give six total transistors.

The related art unit cell of SRAM 10 includes: first and sixth transistors T1 and T6, each having a gate connected to a word line WL and a drain connected to a bit line BL and sub-bit line/BL, respectively; second and fourth transistors T2 and T4 having sources to which a power source voltage Vdd is applied; and driving transistors T3 and T5 having a complimentary metal oxide semiconductor (CMOS) structure in which the third transistor T3 is connected in series with the second transistor T2 and have their gates connected to each other, and the fifth transistor T5 is connected in series to the fourth transistor T4 and have their gates connected to each other.

Referring to FIG. 2, an NMOS active area 101b having NMOS transistors is formed on a semiconductor substrate. Also, a PMOS active area 101a having PMOS transistors is formed on the semiconductor substrate. The NMOS and PMOS active areas 101b and 101a are isolated from each other by an isolation layer.

In the NMOS active area 101b, p-type impurities are implanted to form p-wells for the NMOS transistors T1, T3, T5, and T6. In the PMOS active area 101a, n-type impurities are implanted to form n-wells for the PMOS transistors T2 and T4.

FIGS. 3A and 3B are views illustrating an implant process for forming an active area of the related art SRAM.

The related art unit cell of the 6T SRAM undergoes several implant processes to form NMOS and PMOS transistors. The PMOS implant must be performed by covering the NMOS transistors with a photoresist 123 to expose only a PMOS area, and the NMOS implant must be performed by covering the PMOS transistors with a photoresist 121 and to expose only an NMOS area.

In each of the implant processes for the PMOS and NMOS transistors, a well implant, a pocket implant, an LDD implant, and a source/drain implant must be performed, as well as possibly other implant processes. An NMOS area must be covered with a photoresist in the PMOS implant, and a PMOS area must be covered with a photoresist in the NMOS implant. Accordingly, many photo processes must be performed, thereby increasing fabrication time and reducing yield rate.

Thus, there exists a need in the art for an improved semiconductor device and fabrication method thereof.

BRIEF SUMMARY

Embodiments of the present invention provide a semiconductor device and a fabricating method thereof. A system by interconnection structure can be used, and low cost and high efficiency can be achieved. N-channel metal oxide semiconductor (NMOS) transistors and p-channel metal oxide semiconductor (PMOS) transistors can be formed on separate chips, and the chips can be electrically connected to each other.

In an embodiment, a semiconductor device can include a first chip including transistors of only the NMOS type, a second chip including transistors of only the PMOS type, and an interconnection electrically connecting the first and second chips to each other.

A method of fabricating a semiconductor device can include: forming NMOS transistors on a first chip; forming PMOS transistors on a second chip; and electrically connecting the first and second chips to each other to give a system by interconnection structure.

The details of one or more embodiments are set forth in the accompanying drawings and the detailed description. Other features will be apparent to one skilled in the art from the detailed description, the drawings, and the appended claims.

DETAILED DESCRIPTION

When the terms "on" or "over" are used herein, when referring to layers, regions, patterns, or structures, it is understood that the layer, region, pattern or structure can be directly on another layer or structure, or intervening layers, regions, patterns, or structures may also be present. When the terms "under" or "below" are used herein, when referring to layers, regions, patterns, or structures, it is understood that the layer, region, pattern or structure can be directly under the other layer or structure, or intervening layers, regions, patterns, or structures may also be present.

Figure 1:
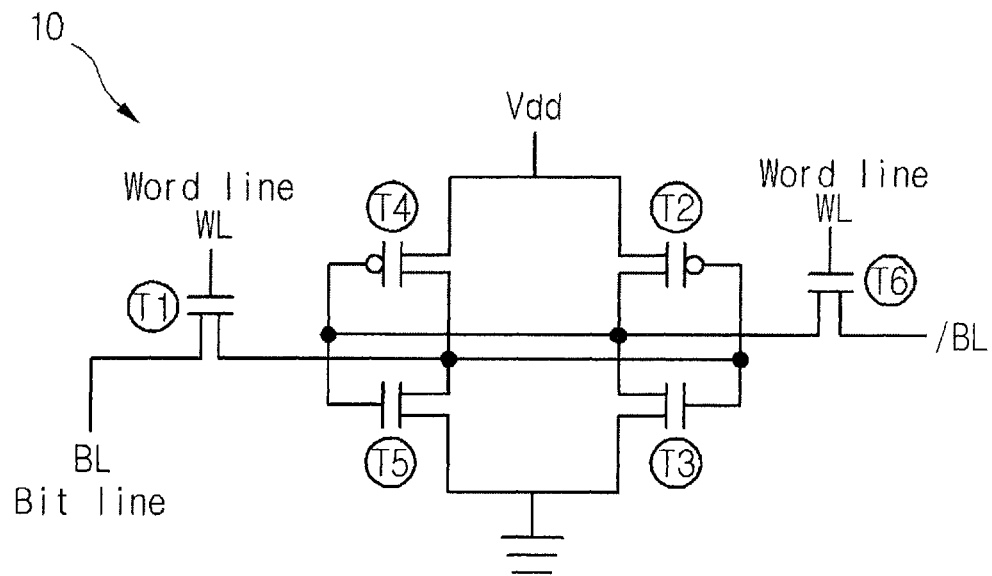
FIG. 1 is a circuit diagram of a unit cell of a conventional static random access memory (SRAM).
Figure 2:
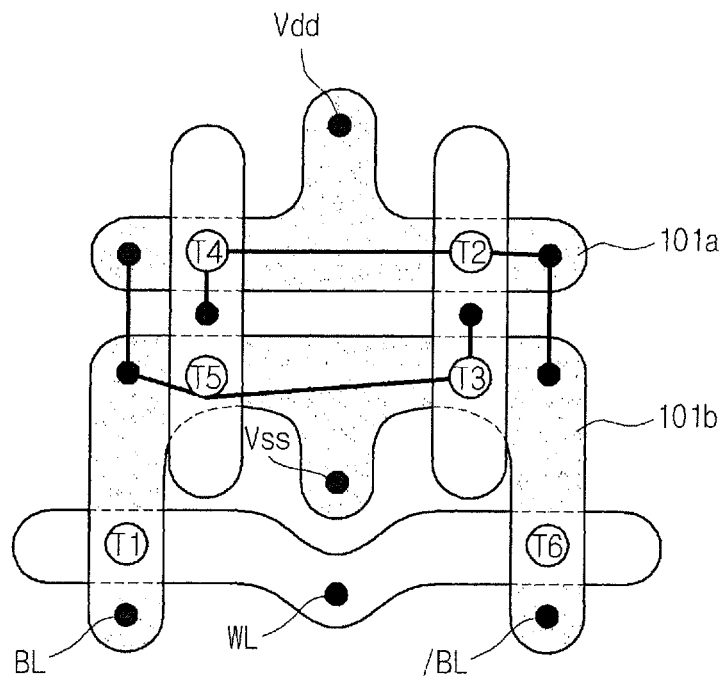
FIG. 2 is a layout view of a unit cell of the conventional SRAM.
Figure 3A:
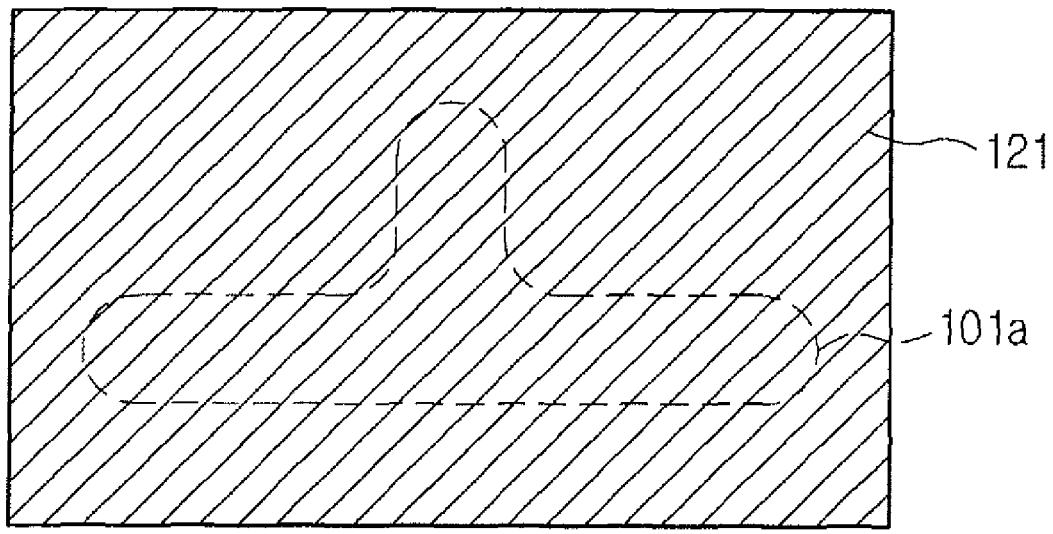
FIGS. 3A and 3B are top views illustrating an implant process for forming an active area of a related art unit cell of the conventional SRAM.
Figure 3A:
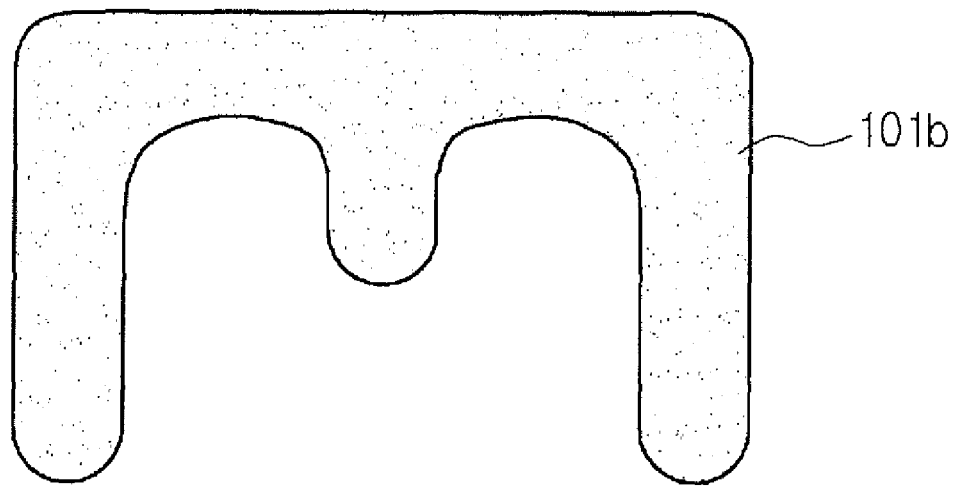
Figure 3B:
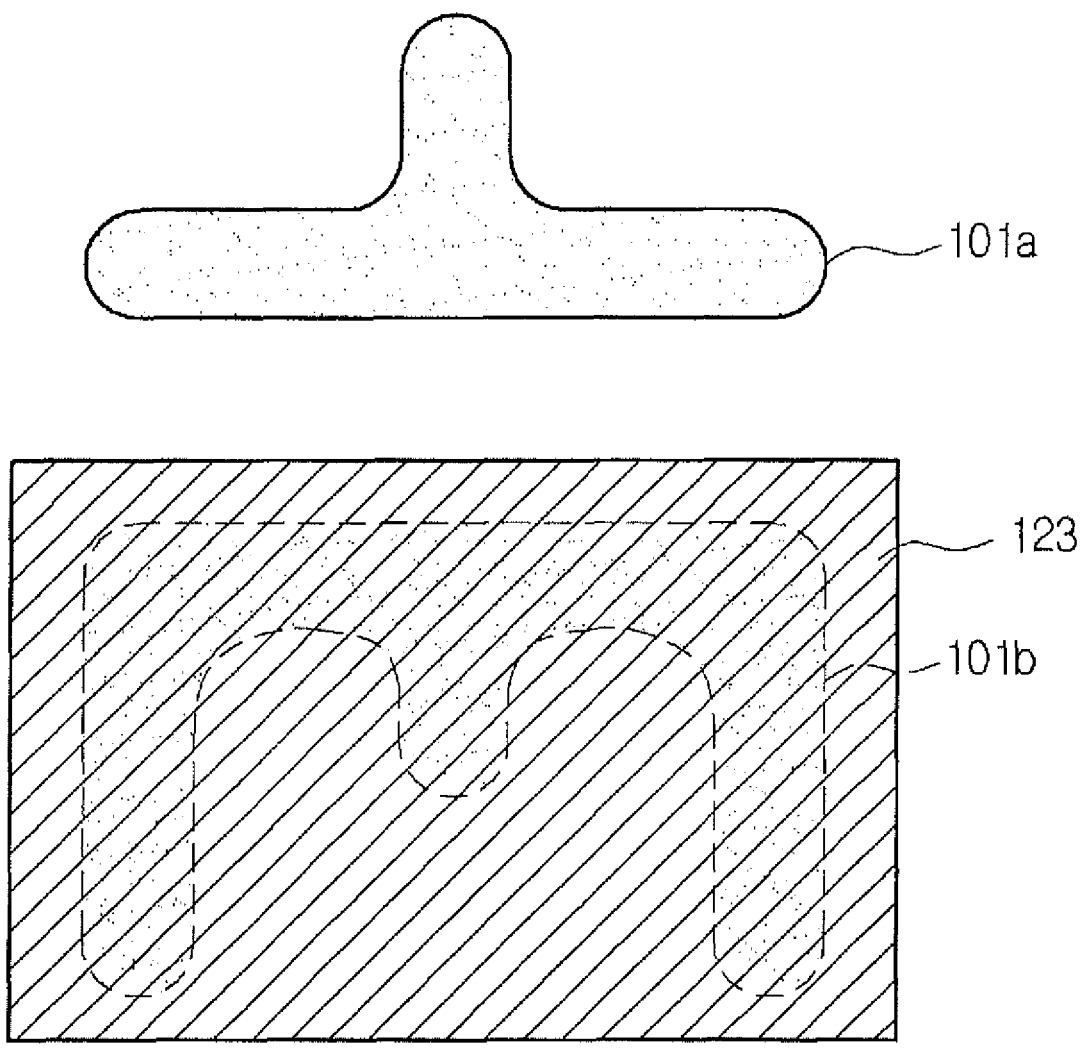
Figure 4:
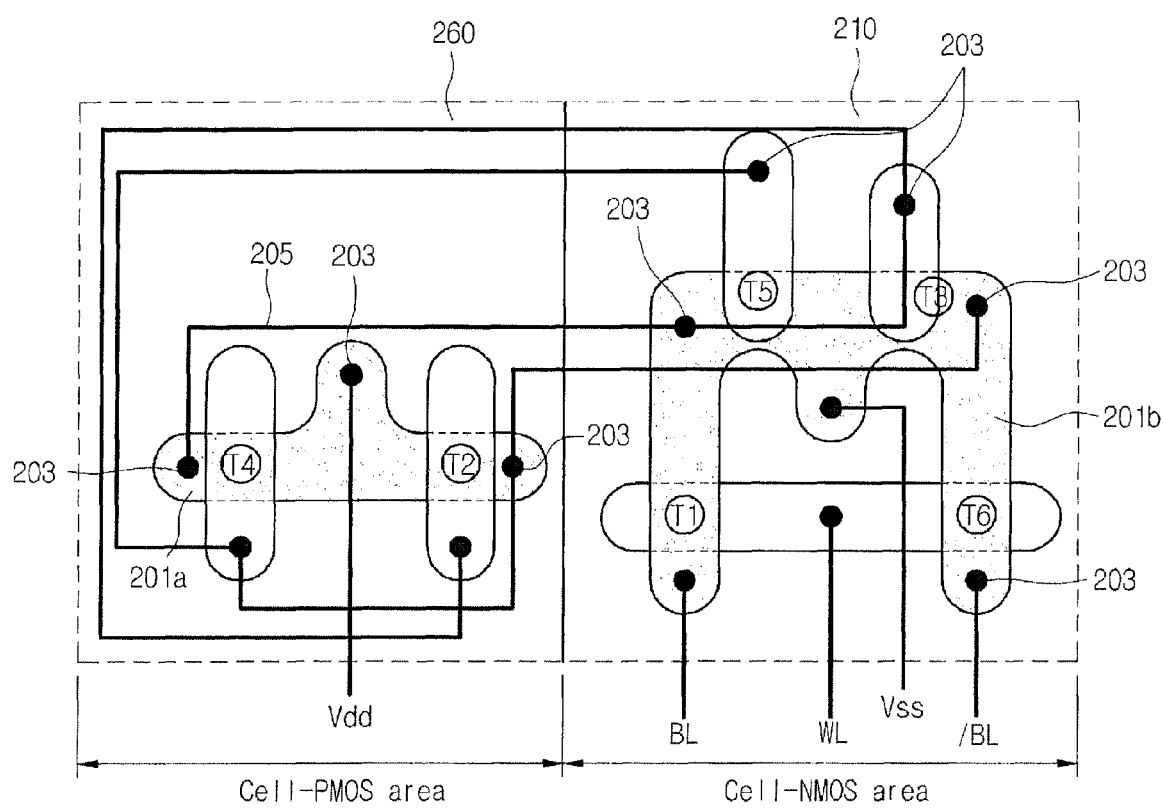
FIG. 4 is a layout view of a unit cell of SRAM according to an embodiment of the present invention.

Referring to FIG. 4, in an embodiment of the present invention, a unit cell of static random access memory (SRAM) can include: first and sixth transistors T1 and T6 each having a gate connected to a word line WL where the drain of T1 is connected to a bit line BL and the drain of T6 is connected to a sub-bit line/BL; second and fourth transistors T2 and T4 having sources to which a power source voltage Vdd can be applied; and driving transistors T3 and T5, where T3 is connected in series to T2 and have connected gates and T5 is connected in series to T4 and have connected gates.

A cell-NMOS (n-channel metal oxide semiconductor) area can be formed in a first chip 210, and a cell-PMOS (p-channel metal oxide semiconductor) area can be formed in a second chip 260 connected to the first chip 210.

NMOS transistors T1, T3, T5, and T6 can be formed in the cell-NMOS area in the first chip 210, and PMOS transistors T2 and T4 can be formed in the cell-PMOS area in the second chip 260.

Although the two PMOS transistors T2 and T4 and the four NMOS transistors T1, T3, T5, T6 are formed in different chips, they can be electrically connected to one another by a structure of interconnections 205 connected through contact holes 203.

Accordingly, a first wafer including the first chip 210 can have a process for forming only NMOS transistors performed on it, and a second wafer including the second chip 260 can have a process for forming only PMOS transistors performed on it.

In an embodiment, a well implant, a pocket implant, an LDD implant, and a source/drain implant can be performed on the first wafer to form the NMOS transistors, and it is unnecessary to consider a PMOS area on the first wafer. Also, a well implant, a pocket implant, an LDD implant, and a source/drain implant can be performed on the second wafer to form the PMOS transistors, and it is unnecessary to consider an NMOS area on the second wafer.

Therefore, photo processes for covering the NMOS transistors with a photoresist and exposing only the PMOS area is not required when performing the PMOS implant. Photo processes for covering the PMOS transistors with a photoresist and exposing only the NMOS area is not required when performing the NMOS implant. Thus, the total number of photo processes can be decreased.

Figure 5A:
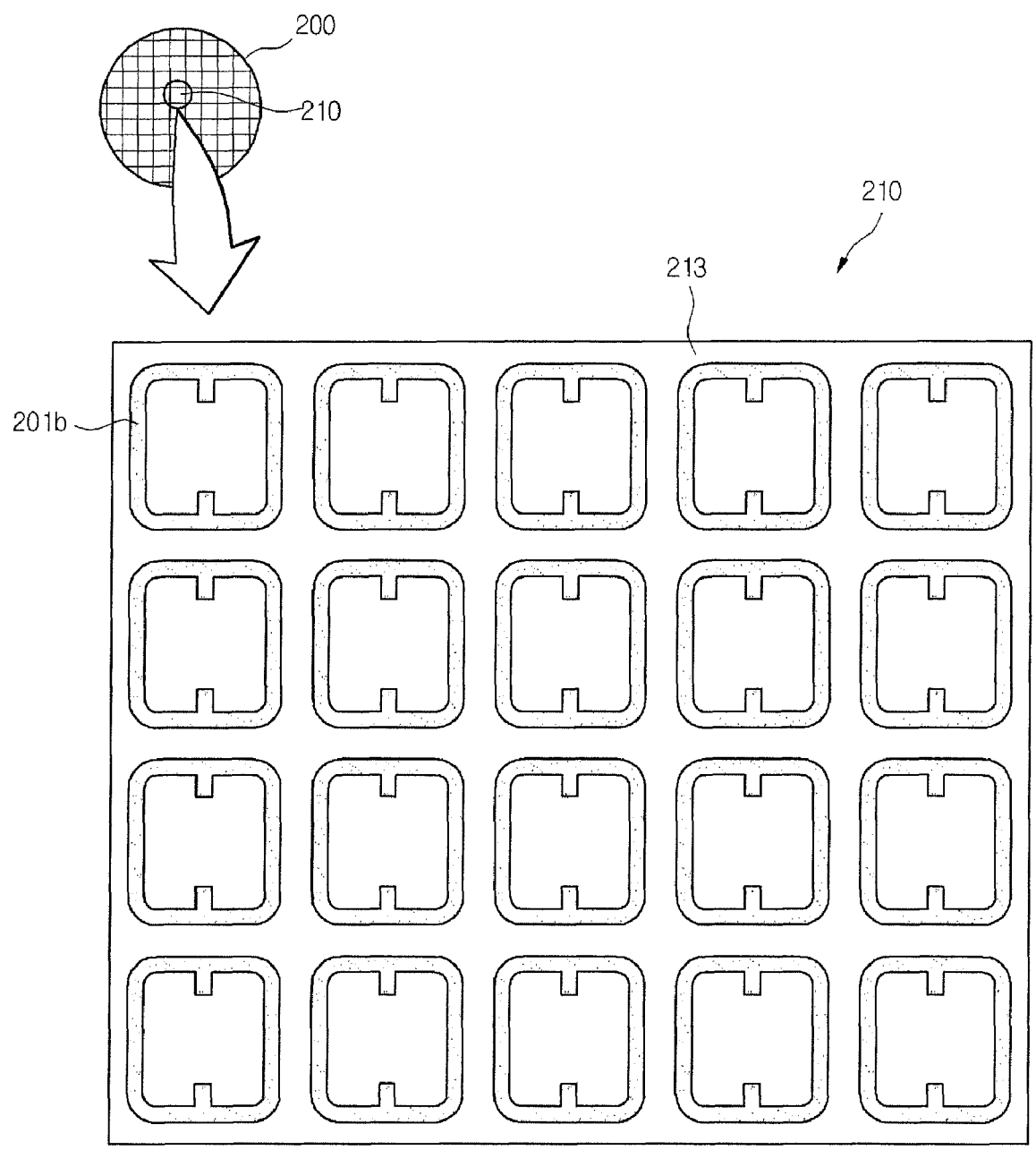
FIG. 5A is a view illustrating an implant process that can be performed on a wafer in a semiconductor device according to an embodiment of the present invention.
Figure 5B:
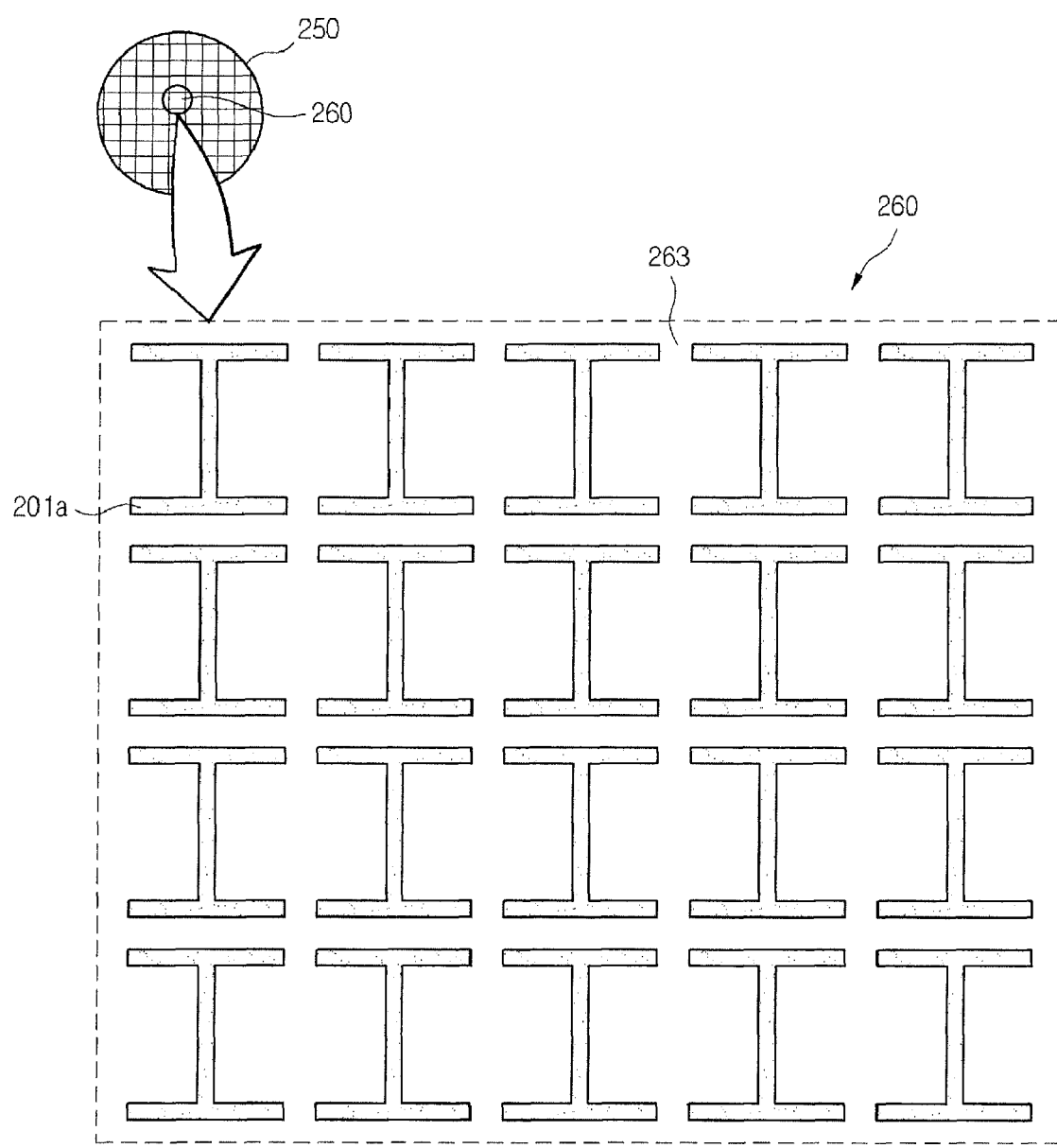
FIG. 5B is a view illustrating an implant process that can be performed on a wafer in a semiconductor device according to an embodiment of the present invention.

FIG. 5A is a view illustrating an NMOS implant process that can be performed on a first wafer in a semiconductor device, and FIG. 5B is a view illustrating a PMOS implant process that can be performed on a second wafer in a semiconductor device according an embodiment.

Referring to FIGS. 5A and 5B, NMOS transistors (and no PMOS transistors) can be formed on the first wafer 200, and PMOS transistors (and no NMOS transistors) can be formed on the second wafer 250. The first chip 210 extracted from the first wafer 200 and the second chip 260 extracted from the second wafer 250 can be formed into a system by interconnection structure. The first and second chips 210 and 260 can be connected to each other to form SRAM.

On the first chip 210 of the first wafer 200, p-type impurities can be implanted into an area defined by a first isolation layer 213 to form an NMOS active area 201b having p-wells.

On the second chip 260 of the second wafer 250, n-type impurities can be implanted into an area defined by a second isolation layer 263 to form a PMOS active area 201a having n-wells.

Figure 6:
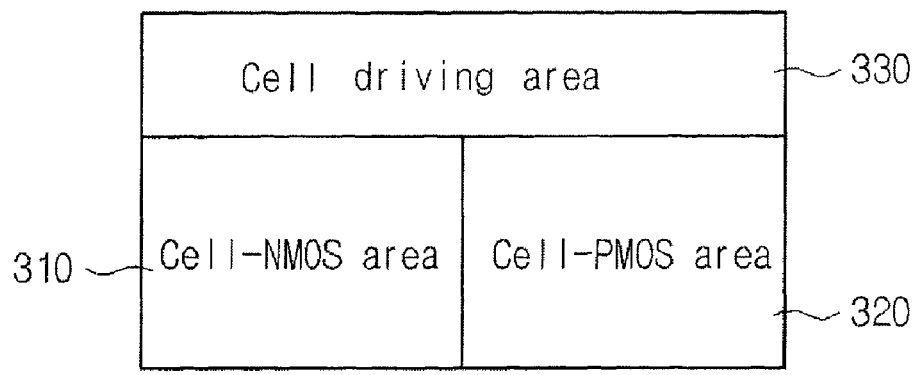
FIG. 6 is a view schematically showing SRAM according to an embodiment of the present invention.

Referring to FIG. 6, in an embodiment, SRAM can have a system by interconnection structure with a cell-NMOS area, a cell-PMOS area, and a cell driving area formed in a first chip 310, a second chip 320, and a third chip 330, respectively. The first chip 310, second chip 320, and third chip 330 can be connected to one another by an interconnection structure to constitute one package.

NMOS transistors can be formed in a cell-NMOS area in the first chip 310, and PMOS transistors can be formed in a cell-PMOS area in the second chip 320.

PMOS and NMOS transistors can be formed together in a cell driving area in the third chip 330.

Although the two PMOS transistors and the four NMOS transistors according to an embodiment of a SRAM can be formed in different chips, they can be electrically connected to one another by a structure of interconnections connected through contact holes.

Accordingly, a first wafer having the first chip 310 can have a process for forming only NMOS transistors performed on it, and a second wafer having the second chip 320 can have a process for forming only PMOS transistors performed on it.

Figure 7:
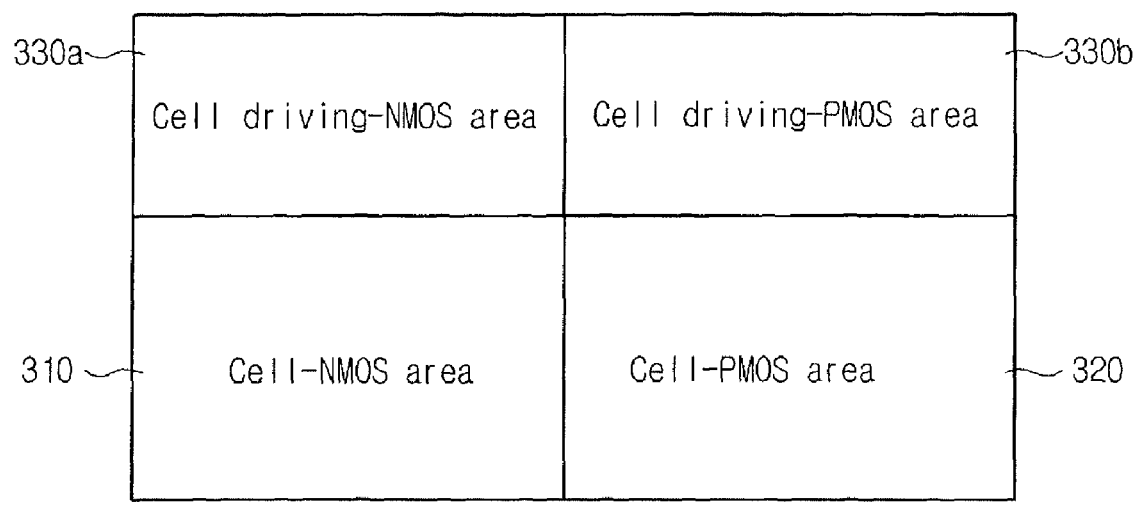
FIG. 7 is a view schematically showing SRAM according to an embodiment of the present invention.

Referring to FIG. 7, in an embodiment, SRAM having a system by interconnection structure can have a cell-NMOS area, a cell-PMOS area, a cell driving-NMOS area, and a cell-driving PMOS area formed in a first chip 310, a second chip 320, a third chip 330a, and a fourth chip 330b. The first chip 310, the second chip 320, the third chip 330a, and the fourth chip 330b can be connected to one another by an interconnection structure to constitute one package.

In an embodiment, the first to fourth chips 310, 320, 330a, and 330b can each be formed on separate wafers. In a further embodiment, at least two chips of the first to fourth chips 310, 320, 330a, and 330b can be formed on one wafer. For example, the first chip 310 and the third chip 330a can be formed on one wafer, or the second chip 320 and the fourth chip 330b can be formed on one wafer. In an embodiment, the first chip 310 and the third chip 330a can be formed on a first wafer, and the second chip 320 and the fourth chip 330b can be formed on a second wafer.

NMOS transistors can be formed in the cell-NMOS area in the first chip 310, and PMOS transistors can be formed in the cell-PMOS area in the second chip 320.

NMOS transistors can be formed in the cell-driving-NMOS area in the third chip 330a, and PMOS transistors can be formed in the cell driving-PMOS area in the fourth chip 330b.

Although the two PMOS transistors and the four NMOS transistors of an embodiment of SRAM can be formed in different chips, they can be electrically connected to one another by a structure of interconnections connected through contact holes.

Accordingly, a first wafer having the first chip 310 can have a process for forming only NMOS transistors performed on it, and a second wafer having the second chip 320 can have a process for forming only PMOS transistors performed on it.

In a semiconductor device having a system by interconnection structure according to an embodiment of the present invention, the number of high-priced photo processes can be decreased, leading to a reduction in fabrication costs. The quantity of implant photo process can be decreased since the NMOS transistors and PMOS transistors can be fabricated on separate wafers.

According to embodiments of the present invention, the additional photo processes and photoresist processes typically included in SRAM implant processes can be eliminated.

To perform a typical implantation process, at least 3 hours can be required in total. About 60 minutes can be required in a photo process for isolating a particular area from other regions; about 20 minutes can be required in an implantation process for the particular area; and about 60 minutes can be required in a photoresist removing process. However, according to embodiments of the present invention, process flow time can be reduced since only about 20 minutes may be required for the actual NMOS and PMOS implantation processes. Accordingly, fabrication cost of a semiconductor device can be considerably reduced, and mass production is possible.

In a semiconductor device having a system by interconnection according to embodiments of the present invention, NMOS transistors subjected to p-type implants and PMOS transistors subjected to n-type implants can be fabricated on separate wafers. The wafers can then be electrically connected to each other to constitute one package. Thus, the total number of implant photo processes can be decreased, thereby reducing the fabrication costs.

According to an embodiment of the present invention, only about 20 minutes may be required for NMOS and PMOS implantation process, thereby reducing process flow time. Accordingly, fabrication cost of a semiconductor device can be considerably reduced, and mass production is possible.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A semiconductor device, comprising:
   a first chip comprising transistors that are only of the n-channel metal oxide semiconductor (NMOS) type;
   a second chip comprising transistors that are only of the p-channel metal oxide semiconductor (PMOS) type;
   an interconnection electrically connecting the first chip and the second chip; and
   a third chip electrically connected to the first chip and the second chip, wherein the third chip comprises cell driving transistors for driving the transistors of the first chip and the transistors of the second chip.

2. A semiconductor device, comprising:
   a first chip comprising transistors that are only of the n-channel metal oxide semiconductor (NMOS) type;
   a second chip comprising transistors that are only of the p-channel metal oxide semiconductor (PMOS) type;
   an interconnection electrically connecting the first chip and second chip;
   a third chip comprising cell driving-NMOS transistors; and
   a fourth chip comprising cell driving-PMOS transistors.

3. A method of fabricating a semiconductor device, comprising:
   forming transistors on a first chip, wherein all transistors formed on the first chip are NMOS transistors;
   forming transistors on a second chip, wherein all transistors formed on the second chip are PMOS transistors; and
   electrically connecting the first chip and the second chip,
   wherein the first chip and the second chip are arranged adjacent to each other in the same plane; and wherein the method further comprises:
   preparing a third chip comprising cell driving transistors for driving the transistors of the first chip and the transistors of the second chip; and
   electrically connecting the third chip to the first chip and the second chip to provide a system by interconnection structure.

4. The method according to claim 3, wherein the first chip is formed on a first wafer, and wherein the second chip is formed on a second wafer.

5. The method according to claim 3, wherein the semiconductor device is SRAM.

6. The method according to claim 3, wherein four NMOS transistors in the first chip and two PMOS transistors in the second chip are electrically connected to form a SRAM cell.

7. The method according to claim 3, wherein electrically connecting the third chip to the first chip and the second chip comprises forming interconnections.

8. The method according to claim 3, wherein forming transistors on the first chip comprises forming p-wells in an NMOS active area of the first chip.

9. The method according to claim 3, wherein forming transistors on the second chip comprises forming n-wells in a PMOS active area of the second chip.

10. A method of fabricating a semiconductor device, comprising:
    forming transistors on a first chip, wherein all transistors formed on the first chip are NMOS transistors;
    forming transistors on a second chip, wherein all transistors formed on the second chip are PMOS transistors; and
    electrically connecting the first chip and the second chip,
    wherein the first chip and the second chip are arranged adjacent to each other in the same plane; wherein the method further comprises:

preparing a third chip comprising cell driving-NMOS transistors; and preparing a fourth chip comprising cell driving-PMOS transistors.

11. The method according to claim 10, wherein the first chip is formed on a first wafer, and wherein the second chip is formed on a second wafer, and wherein the third chip is formed on a third wafer, and wherein the fourth chip is formed on a fourth wafer.

12. The method according to claim 10, wherein the first chip and the third chip are formed on a first wafer, and wherein the second chip and the fourth chip are formed on a second wafer.

13. The method according to claim 10, further comprising electrically connecting the third chip and the fourth chip to the first chip and the second chip to provide a system by interconnection structure.

14. The method according to claim 13, wherein electrically connecting the third chip and the fourth chip to the first chip and the second chip comprises forming interconnections.

* * * * *